US005854804A

United States Patent [19]
Winer et al.

[11] Patent Number: 5,854,804
[45] Date of Patent: Dec. 29, 1998

[54] METHOD AND APPARATUS FOR SYNCHRONIZING A MODE LOCKED LASER WITH A DEVICE UNDER TEST

[75] Inventors: Paul Winer; Mario J. Paniccia, both of Santa Clara, Calif.

[73] Assignee: Intel Corporation, Santa Clara, Calif.

[21] Appl. No.: 766,018

[22] Filed: Dec. 13, 1996

[51] Int. Cl.$^6$ ........................................... H01S 3/00
[52] U.S. Cl. .................. 372/38; 372/18; 372/25; 372/33; 364/579
[58] Field of Search ..................... 372/38, 25, 18, 372/33; 364/579

[56] References Cited

U.S. PATENT DOCUMENTS 5,072,417  12/1991  Aton et al. ............................... 364/579

OTHER PUBLICATIONS

K.J. Weingarten et al., Picosecond Optical Sampling of GaAs Integrated Circuits, IEEE J Quantum Electronics 24(2) (1988).

Paul Winer, "IC Failure Analysis, E–Beam Tutorial," International Reliability and Physics Symposium, 1996.

*Primary Examiner*—Leon Scott, Jr.
*Attorney, Agent, or Firm*—Blakely, Sokoloff, Taylor & Zafman

[57] ABSTRACT

A method and an apparatus for synchronizing a mode locked laser with a device under test. The present invention provides a stroboscopic technique that synchronizes the free running laser pulses of a mode locked laser to a DUT enabling the optical testing of integrated circuits to be performed and waveform measurements to be acquired from a DUT at random operating frequencies. In one embodiment, a laser synchronizing apparatus is configured to be used to test a device under test. The laser synchronizing apparatus includes a mode locked laser generating repeating laser pulses having a first period. A test pattern operating in M clocks when executed on the device under test is constructed. M is an integer and each one of the M clocks has a second period. A time per test pattern is computed such that the time per test pattern provides a sufficient amount of time to execute the constructed test pattern operating in the M clocks. The time per test pattern is a common multiple of the first period and the second period such that N laser pulses are generated during the time per test pattern with N being an integer. The test pattern is looped on the device under test with the laser synchronizing apparatus synchronized with the mode locked laser and each loop of the test pattern taking the time per test pattern to execute.

28 Claims, 5 Drawing Sheets

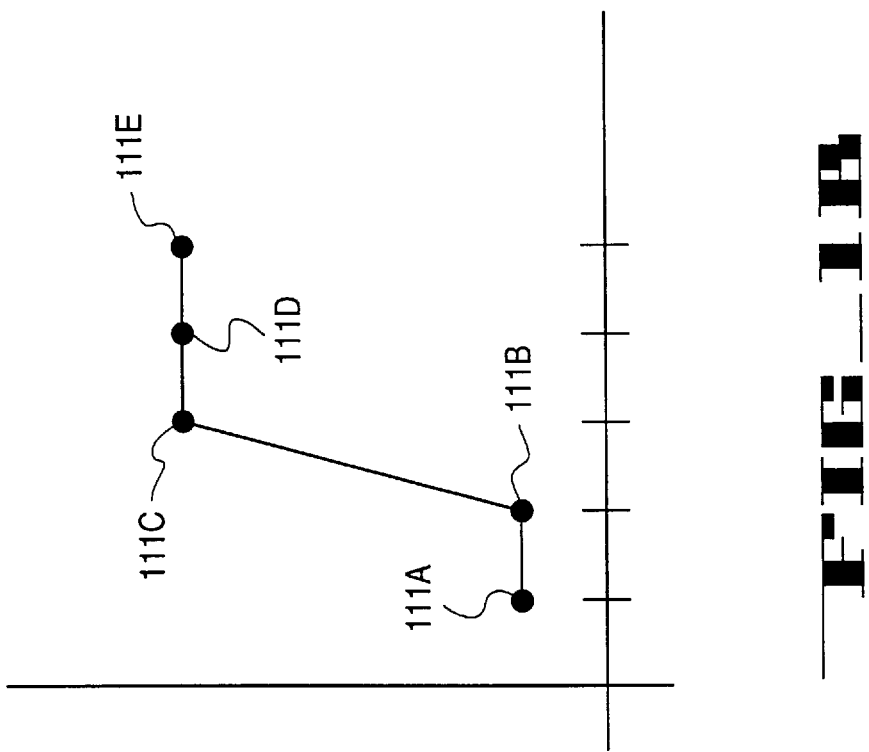
FIG._1B

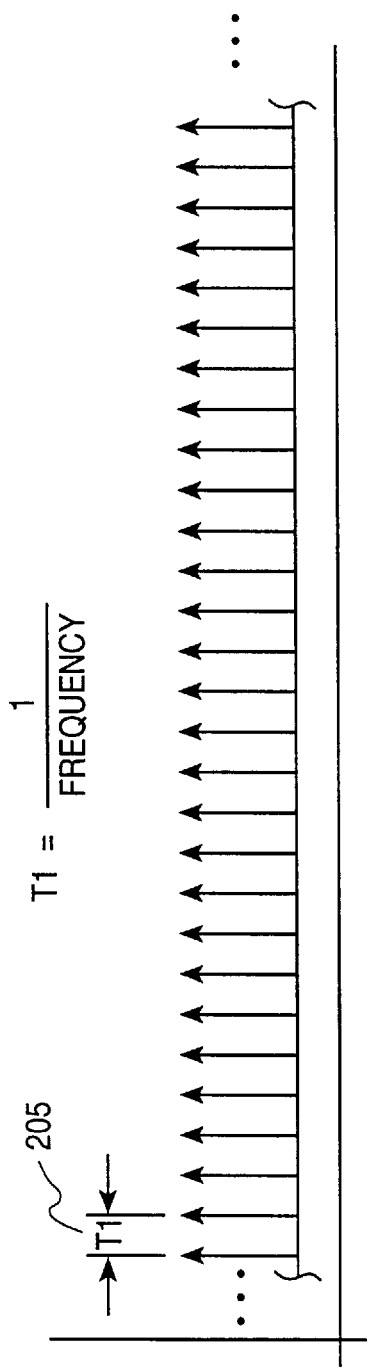

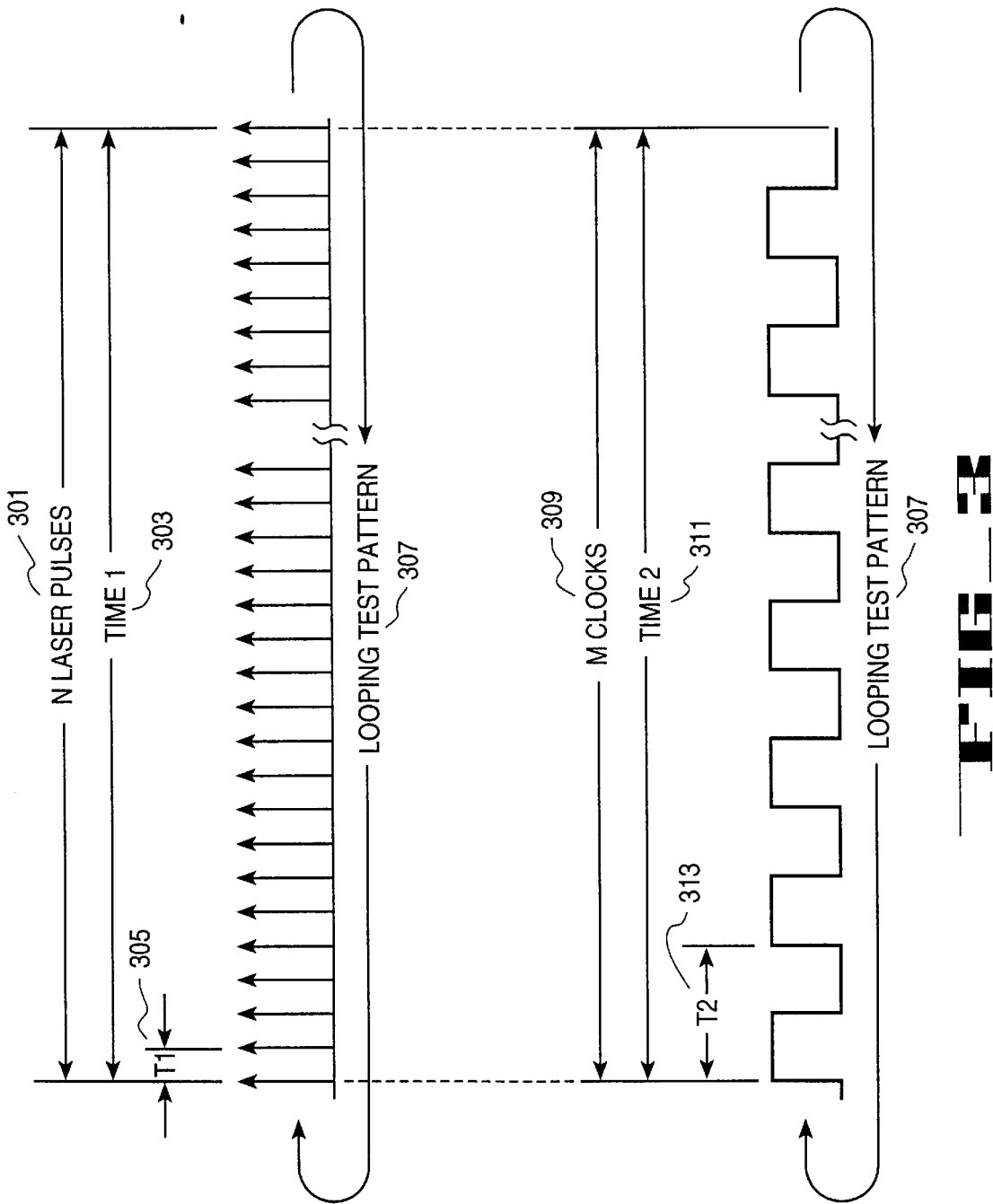

METHOD AND APPARATUS FOR SYNCHRONIZING A MODE LOCKED LASER WITH A DEVICE UNDER TEST

BACKGROUND OF THE INVENTION

1. Field of the Invention

The present invention relates generally to integrated circuit testing and, more specifically, the present invention relates to integrated circuit testing using a free running mode locked laser.

2. Description of the Related Art

Silicon debug and failure analysis are some of the important procedures performed during the design manufacture and testing of today's integrated circuits. During these procedures, it is sometimes helpful for engineers to acquire waveforms directly from the internal nodes of the integrated circuits while they are operating. One prior art method for electrically probing the internal nodes of integrated circuits is performed using an electron beam (e-beam) system. On an e-beam system, the electron probe beam is synchronized to the device under test (DUT). Using elaborate stroboscopic techniques, waveforms can be acquired directly from integrated circuit nodes. One reason why this is possible is because an e-beam prober can be precisely blanked or triggered on demand.

An e-beam prober is a tool that uses the interaction of a low voltage electron beam with the electrical nodes or interconnections of an integrated circuit to measure time resolved voltage waveforms directly from the electrical nodes or interconnections. Basically, a prior art e-beam prober is capable of measuring the time resolved waveforms directly from integrated circuit connections of interest by focusing the electron beam on the electrical connections of interest at precise times and then measuring the returning secondary electrons to determine the voltage at the electrical connection of interest. As will be discussed, by using stroboscopic techniques, waveforms can then be reconstructed from looping test patterns driving or executing on the DUT.

FIG. 1A illustrates one prior method for stroboscopically constructing a waveform measured with an e-beam probe from a DUT while operating. The DUT clock acts as the master clock and the e-beam probe is configured as the slave. That is, the e-beam probe is triggered off of the DUT clock and is therefore synchronized with the DUT clock. FIG. 1A shows clock signal 101 of the DUT during four cycles of a looping test pattern which is repeatedly executed on the DUT. Trace 103 is a waveform at a particular electrical connection of interest in the DUT. As shown in FIG. 1A, the waveforms on trace 103 repeat for each looping test pattern. With DUT clock 101 acting as the master, a trigger signal 105 on a tester apparatus that controls the e-beam probe is precisely synchronized with each looping test pattern being executed on the DUT. Finally, the e-beam probe is triggered as shown in trace 107 at precise times during each looping test pattern on the DUT to stroboscopically sample the waveforms shown in trace 103.

As shown in FIG. 1A, each time the e-beam probe is triggered as indicated by trace 107, a sample point is acquired from the waveforms of trace 103. In particular, the e-beam pulse indicated by pulse 109A acquires sample point 111A. As shown in FIG. 1A, pulse 109A is aligned with the corresponding trigger signal of trace 105. Next, the e-beam pulse corresponding with pulse 109B is used to acquire sample point 111B. As shown in FIG. 1 A, pulse 109B is delayed by an amount ΔT from the corresponding trigger signal of trace 105. Next, the e-beam pulse corresponding with pulse 109C is used to acquire sample point 111C. Pulse 109C is delayed by 2ΔT after the corresponding trigger signal of trace 105. The e-beam pulse corresponding with pulse 109D is used to acquire sample point 111 D. Pulse 109D is delayed by 3ΔT after the corresponding trigger signal of trace 105. Finally, the e-beam pulse corresponding with pulse 109E is used at acquire sample point 111E from waveform 103. Pulse 109E is delayed by 4ΔT after the corresponding trigger signal 105.

FIG. 1B shows the reconstructed waveform 151 from sampled data points 111A, 111B, 111C, 111D and 111E. Thus, by looping a test pattern on a DUT and stroboscopically sampling measurement points from waveforms at different locations during each looping test pattern, waveforms on the DUT can be measured and then reconstructed.

As technology pushes DUT operating frequencies to higher and higher frequencies, there is considerable interest to move to optical based testing of integrated circuits. In order to perform optical based sampling high frequency, small pulse, mode locked lasers are used. Once such prior art technique to stroboscopically sample waveforms from operating devices under test utilizes a free running, solid state, mode locked laser. In contrast with the e-beam probing technique discussed above, laser beam pulses from a mode locked laser cannot be triggered on demand like electron beam pulses. To illustrate, FIG. 2 shows how a mode locked laser emits free running, fixed frequency pulses 201. Each laser beam pulse is emitted at a fixed frequency with a period of T1 205 (period=1/frequency) and consequently cannot be triggered on demand like electron beam pulses. As a result, the laser pulses of the mode locked laser therefore cannot be triggered and or synchronized with a DUT operating at a random frequency as used in prior art techniques.

One prior art technique to accommodate the limitation of free running mode locked lasers not having the ability to emit laser pulses on demand is to establish the mode locked laser as the master and configure the DUT to act as the slave. In this prior art technique, the DUT is operated at a slightly different frequency than the laser. For instance, assuming the mode locked laser emits the free running laser pulses at a fixed frequency such as 100 MHz, the DUT may be run at a slightly greater frequency such 100 MHz+1 Hz. As a result, the laser pulses 201 are only slightly out of phase with the DUT frequency and this results in the laser pulses stroboscopically traversing through the waveform patterns of interest on the DUT. Thus, stroboscopic waveform sampling is possible with free running mode locked lasers using this technique.

The major limitation with this technique, however, is that waveform recovery from the DUT may be made only at frequencies near the fixed frequency of the mode locked laser or integer multiples of the laser operating frequency (e.g. 200 MHz, 300 MHz, etc.). This however is not practical in real integrated circuit testing environments since in order to use mode locked lasers during silicon debug and failure analysis, the DUT may need to be operated at a variety of different random operating frequencies not necessarily near the operating frequency of the mode locked laser.

Therefore, what is needed is a method and an apparatus that synchronizes the free running laser pulses of a mode locked laser to a DUT allowing optical testing and the ability to acquire stroboscopic waveforms from a DUT without the limitation of operating the DUT at a frequency near the operating frequency or an integer multiple of the mode locked laser. Such a method and an apparatus should provide the ability to perform optical testing of integrated circuits during silicon debug and failure analysis of devices under test at random frequencies using a mode locked laser.

SUMMARY OF THE INVENTION

A method and an apparatus for synchronizing a mode locked laser generating repeating laser pulses having a fixed period with a device under test (DUT) is disclosed. In one embodiment, a test pattern operating in M clocks when executed on a DUT is constructed. M is an integer and each one of the M clocks has a second period that may be different from the fixed period of the laser. A time per test pattern is the time to execute the test pattern operating in M clocks. M is selected such that the time to generate N laser pulses is also equal to the time per test pattern. N is also an integer. Therefore the time per test pattern is a common multiple of the fixed period and the second period. When the test pattern of M clocks is looped on the DUT, the mode locked laser is synchronized such that the laser pulses remain in a fixed and stable phase relationship to the DUT clock. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

FIG. 1B is an illustration of a reconstructed waveform with data points sampled using stroboscopic techniques FIG. 2 is an illustration of the repeating fixed frequency pulses of a free running mode locked laser.

FIG. 3 is an illustration of the N laser pulses of a free running mode locked laser and the M clocks of a DUT for each looping test pattern in accordance with the teachings of the present invention.

DETAILED DESCRIPTION

A method and an apparatus for synchronizing a mode locked laser generating repeating laser pulses with a device under test (DUT) is disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

The present invention provides a stroboscopic technique that synchronizes the free running laser pulses of a mode locked laser to a DUT enabling the optical testing of integrated circuits to be performed and waveform measurements to be acquired from a DUT at random operating frequencies. The limitation in the prior art of the inability to trigger laser pulses on demand, which prevents the stroboscopic acquisition of waveforms using prior art techniques, is solved with the present invention. Synchronization is accomplished with the present invention by making the period or time per looping test pattern being executed on the DUT equal to the period or time per test pattern of the pulsed picked mode locked laser pulses. This is accomplished by the present invention by setting the number of laser pulses per looping test pattern times the period between each laser pulse equal to the number of DUT clock cycles per looping test pattern times the period of the each DUT clock. In doing so, at least one clock edge of the DUT clock and at least one pulse of the mode locked laser will be synchronized with each other at least one time during each looping test pattern. By combining well known phase lock loop and time delay generation techniques, a sampling laser pulse can be positioned at any location in the test pattern or waveform to enable optical testing and waveform measurements to be taken at nearly any practical DUT operating frequency.

To illustrate, FIG. 3 shows the N laser pulses 301 emitted by a free running mode locked laser in a period of time TIME1 303 during a looping test pattern 307 which is synchronized with the M clocks 309 of a DUT executing looping test pattern 307 during a time TIME2 311. As shown in FIG. 3, the period of time between each laser pulse is T1 305 and the period of each clock cycle is T2 313.

Figure 1A:
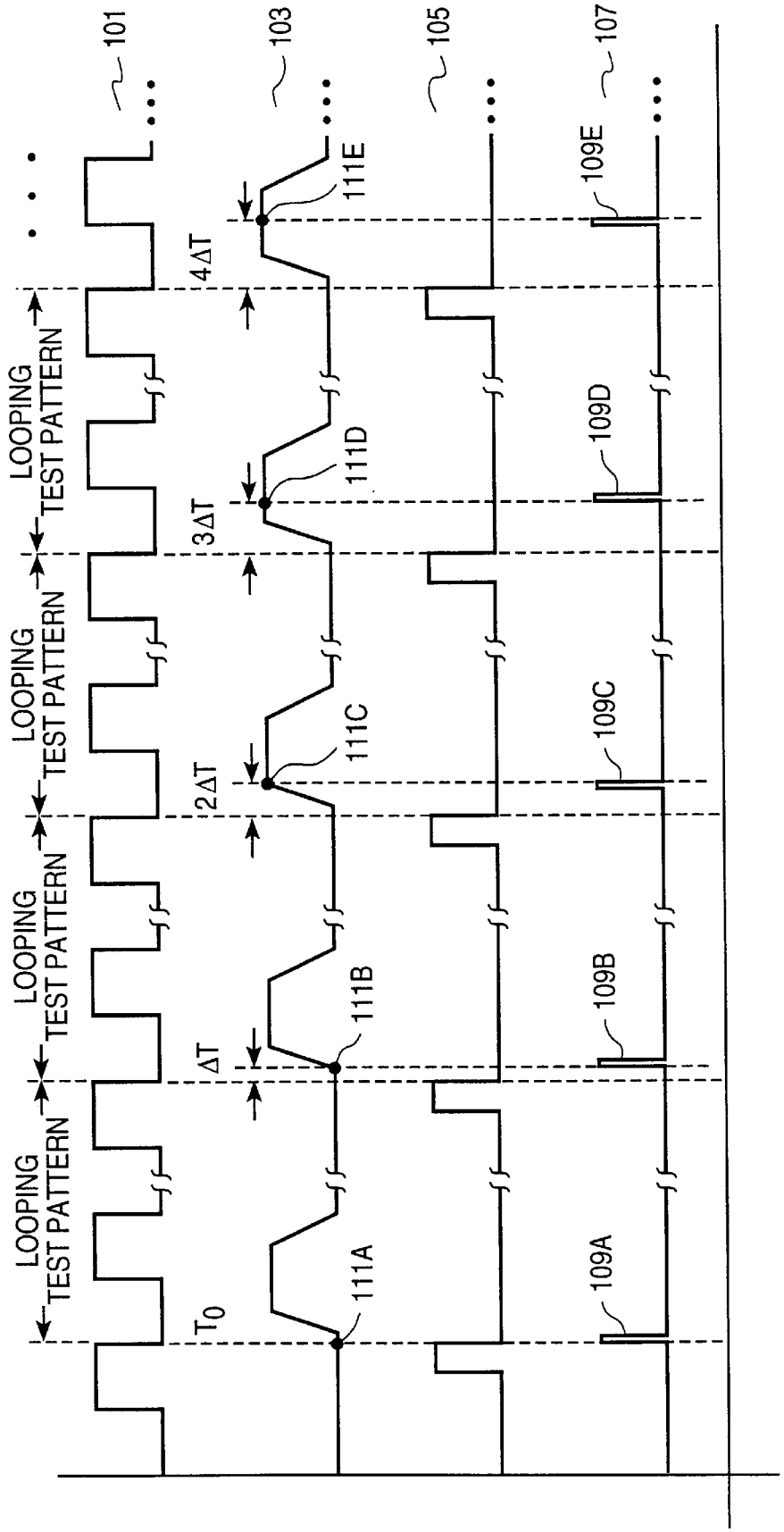
FIG. 1A is an illustration of an e-beam probe stroboscopically sampling a waveform from a DUT operating a looping test pattern.

In practice, a test pattern is constructed to be looped on a DUT, which generates waveforms such as for example those waveforms shown in trace 103 of FIG. 1A. The constructed test pattern is looped continuously so as to allow the optical testing and stroboscopic sampling of waveforms as described above. In one embodiment of the present invention, the mode locked laser is synchronized with the DUT by constructing the test pattern such that M and N satisfy the following equation:

$$M \cdot T2 = N \cdot T1 \qquad \text{(Equation 1)}$$

where M is the number of clocks lapsed for the DUT for each looping test pattern, T2 is the period for each clock of the DUT, N is the number of laser pulses emitted by the free running mode locked laser during each looping test pattern and T1 is the period for each laser pulse. M and N are integers.

It is observed that since $$N \cdot T1 = TIME1 \qquad \text{(Equation 2)}$$

and $$M \cdot T2 = TIME2 \qquad \text{(Equation 3)}$$

substituting Equations 2 and 3 into Equation 1 returns the following result:

$$TIME1 = TIME2 \qquad \text{(Equation 4)}$$

With TIME1 303 equal to TIME2 311 and integer values selected for M and N, at least one pulse of the free running mode locked laser is synchronized with at least one clock edge of the DUT clock during each looping test pattern 307. As long as integer values are selected for M and N, the frequency of the DUT clock may effectively be selected at random so long as Equation 1 is satisfied. It is noted that there may be instances where the free running mode locked laser and the DUT clock may be synchronized more than once during each looping test pattern. In these instances, the mode locked laser may be resynchronized with the DUT clock using well known phase locked loop techniques.

In one embodiment of the present invention, the frequency of the free running mode locked laser can be varied and adjusted. For example, in one embodiment of the present invention, the mode locked laser has an operating frequency of 100 MHz and can be offset by approximately 100 Hz. Accordingly, the number of acceptable values for M and N in Equations 1–3 above is increased by taking advantage of the fact that the frequency of the laser may be varied or adjusted within the operating range of the mode locked laser. Equation 5 below is a second constraint which can be used to determine values for M and N:

$$\frac{N}{(N \cdot T1) - (M \cdot T2)} < \text{RANGE} \qquad \text{(Equation 5)}$$

where RANGE is the operating range of the mode locked laser. In the example with the mode locked laser having a frequency of 100 MHz and the operating range being approximately 100 Hz, RANGE equals 100.

One embodiment of the present invention is employed with a laser synchronizing apparatus to test a DUT. In practice, a test pattern is constructed to test the DUT. In order to employ the free running mode locked laser of the present invention, the test pattern is typically modified so as to satisfy the requirement of integer values for M and N in accordance with Equations 1-5 above. In some instances, the test pattern may be lengthened by adding dummy operations to the test pattern. In other instances, the test pattern can be shortened by removing unneeded instructions in the test pattern. Once the test pattern is constructed and integer values are selected for M and N such that the time to execute the test pattern is equal to the amount of time for N pulses to be emitted, the test pattern may be looped on the DUT to enable optical testing and/or stroboscopic waveform acquisition.

In practice, the time to execute each looping test pattern, shown as TIME1 303 and/or TIME2 311 in FIG. 3, is typically a least common multiple of T1 305 and T2 313 with the additional requirement of the total time per test pattern being a sufficient amount of time to execute the test pattern of interest. It is appreciated, however, that the time per test pattern, which is shown as TIME1 303 or TIME2 311 in FIG. 3, is not limited to being the least common multiple of period T1 305 and period T2 313. That is, the time per test pattern may be any common multiple of period T1 305 and period T2 313 so long as M and N are integer values and the total time per test period is a sufficient amount of time to execute each looping test pattern 307.

Figure 4:
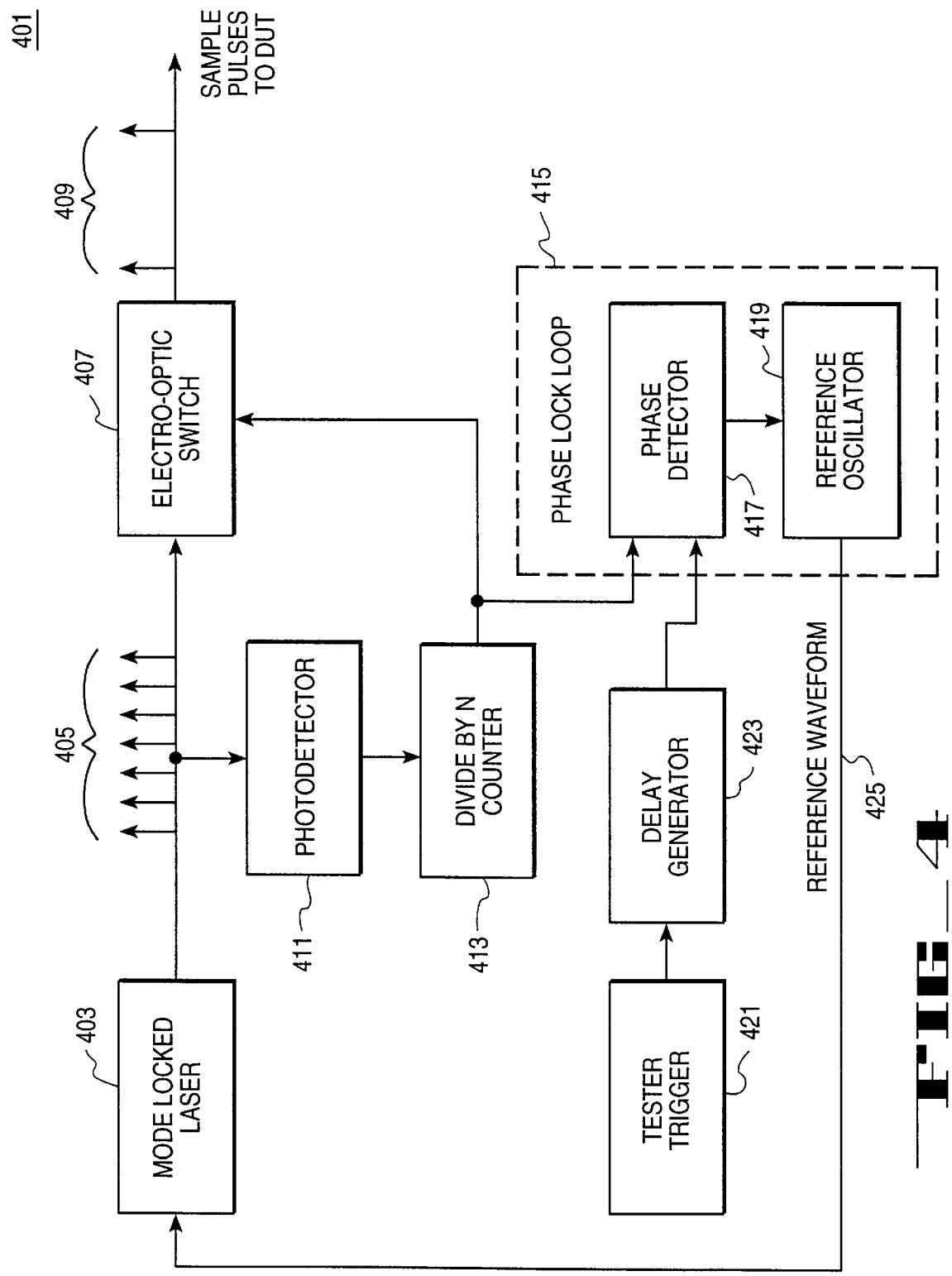
FIG. 4 is a block diagram of a laser synchronizing apparatus synchronizing a mode locked laser with a DUT in accordance with the teachings of the present invention.

FIG. 4 is a block diagram of a laser synchronizing apparatus 401 in accordance with the teachings of the present invention. Laser synchronizing apparatus 401 includes a mode locked laser 403 which generates free running fixed frequency laser pulses 405 which are passed through an electro-optic switch 407 of sufficient bandwidth to select sampling output pulses 409 which are used to optically test and/or stroboscopically sample waveforms from a DUT. The mode locked laser pulses 405 are also sampled and counted through a programmable counter/divider, shown as divide by N counter 413, whose output is used to trigger the electro-optic switch 407.

As discussed above, a test pattern for the DUT is constructed so that the test pattern operates the DUT in a looping test pattern with a trigger pulse being generated by tester trigger 421 to synchronize the DUT with laser synchronizing apparatus 401. In one embodiment of the present invention, the trigger pulses are produced every M times T2 seconds in accordance with Equations 1-5 above. As discussed above, mode locked laser 403 produces a period of pulses N times T1 seconds long where N is the number of laser pulses emitted and T1 is the period of time between each laser pulse.

Accordingly, at least one clock edge of the DUT clock is aligned with at least one laser pulse during each looping test pattern in laser synchronizing apparatus 401. Phase lock loop 415 includes a phase detector 417 coupled to receive the signal controlling electro-optic switch 407 and a trigger signal from tester trigger 421 to compare the sampling pulses 409 and the trigger pulses and synchronize them with one another. Reference oscillator 419 is coupled to the phase detector 417 of the phase lock loop 415 to generate a reference waveform 425 received by mode locked laser 403 to control the operating frequency of the mode locked laser 403. This enables the period of the free running fixed frequency laser pulses 405 to be adjusted within the operating range of the mode locked laser and enables the laser pulses 405 to be synchronized with the tester trigger 421. That is, the reference oscillator 419 can slightly vary or adjust the frequency of reference waveform 425 to improve synchronization of the sample pulses 409 to the DUT.

In addition, a programmable delayed generator 423 is inserted between tester trigger 421 and phase detector 417 to enable one to vary and adjust the phase of sampling pulses 409 relative to trigger pulses output by the tester trigger 421 to allow one to place a sampling pulse 409 at any location in the test pattern or waveform. This can be illustrated in FIG. 1A in which sampling pulses 109A through 109E are incrementally delayed by 0 to 4ΔT to acquire sample points 111A through 111E for sampled waveform 151 of FIG. 1B.

As also shown in FIG. 4, a photodetector 411 may be configured in one embodiment of the present invention to detect the free running laser pulses 405 for divide by N counter 413.

In another embodiment of the present invention, the DUT clock may be changed during a looping test pattern. This enables clock stretching or clock shrinking during testing. The frequency of the DUT clock may be changed in accordance with the teachings of the present invention so long as the total time for the integer number of laser pulses to be emitted during each looping test pattern equals the total time of the test loop with an integer number of clocks. Equation 6 below shows this relationship for two clock frequencies being used to clock the DUT per looping test pattern:

$$N \cdot T1 = (M \cdot T2) + (K \cdot T3) \qquad \text{(Equation 6)}$$

where N is the number of laser pulses emitted during the looping test pattern, T1 is the period of time between each laser pulse being emitted, M is the number of clocks at a first DUT clock frequency, T2 is the period of the clock at the first DUT clock frequency, K is the number of clocks at a second DUT clock frequency and T3 is the period of the clock at the second DUT clock frequency. It is also appreciated that if the mode locked laser has an operating range, such as ±100 Hz as discussed in the example above, the integer values for N, M and K may also be varied accordingly to satisfy Equation 6.

In another embodiment of the present invention, electro-optic switch 407 may be configured to select more than one sample pulse per looping test pattern. In some instances, every pulse 405 may be passed through electro-optic switch 407 to enable massive sampling. Delay generator 423 is still used to incrementally shift the sample location of each pulse down the test pattern or waveform of interest to reconstruct waveforms.

In one embodiment of the present invention, laser synchronizing apparatus 401 is operated in a tester environment with a tester apparatus (not shown) to test a DUT. In another embodiment of the present invention, laser synchronizing apparatus 401 may be operated using well known techniques in a system operating environment such as for example on a PC board, a computer motherboard or the like when the DUT is tested. That is, laser synchronizing apparatus 401 also provides DUT testing while DUT is operated in an actual system. As a result, the present invention enables the testing and debugging integrated circuits while the parts are operating on a tester apparatus or in a system operating environment.

Thus, what has been described is a method and an apparatus for synchronizing a mode locked laser generating repeating laser pulses with a DUT. With the presently described method and apparatus, optical testing of integrated circuits and waveform measurements may be acquired at nearly any practical operating frequency of the DUT. In the foregoing detailed description, the method and apparatus of the present invention has been described with reference to specific exemplary embodiments thereof. It will, however, be evident that modifications and changes may be made thereto without departing from the broader spirit and scope of the present invention. The present specification and figures are accordingly to be regarded as illustrative rather than restrictive.

What is claimed is:

1. A method for synchronizing a mode locked laser generating repeating laser pulses having a fixed period with a device under test (DUT), the method comprising the steps of:
   constructing a test pattern operating in M clocks when executed on the DUT, M being an integer and each one of the M clocks has a second period;
   computing a time per test pattern, the time per test pattern being a common multiple of the fixed period and the second period such that N laser pulses are generated during the time per test pattern, N being an integer; and
   looping the test pattern on the DUT with the mode locked laser such that the laser pulses remain in a fixed and stable phase relationship to the DUT clock.

2. The method described in claim 1 wherein the step of constructing the test pattern operating in M clocks includes the step of modifying the test pattern so as to result in the test pattern taking the M clocks to operate when executed on the DUT.

3. The method described in claim 2 wherein the step of modifying the test pattern includes the step of lengthening the test pattern such that the lengthened test pattern takes the M clocks to operate when executed on the DUT.

4. The method described in claim 2 wherein the step of modifying the test pattern includes the step of shortening the test pattern such that the shortened test pattern takes the M clocks to operate when executed on the DUT.

5. The method described in claim 1 including the additional step of varying the fixed period of the repeating laser pulses within an operating range of the mode locked laser such that the M clocks are lapsed and the N laser pulses are generated in the time per test pattern.

6. The method described in claim 1 wherein the step of looping the test pattern on the DUT includes the step of phase locking the repeating laser pulses with a trigger signal on a tester apparatus.

7. The method described in claim 6 wherein the step of looping the test pattern on the DUT includes the additional step of selecting at least one sampling pulse from the repeating laser pulses within each loop of the test pattern to stroboscopically sample a waveform on the DUT.

8. The method described in claim 7 wherein the step of looping the test pattern on the DUT includes the additional step of incrementally varying a phase difference between the trigger signal and the repeating laser pulses to stroboscopically sample the waveform on the DUT.

9. The method described in claim 8 wherein the step of incrementally varying the phase difference between the trigger signal and the repeating laser pulses includes the step of incrementally delaying the at least one sampling pulse to stroboscopically sample the waveform on the DUT.

10. The method described in claim 8 wherein the step of incrementally varying the phase difference between the trigger signal and the repeating laser pulses includes the step of incrementally delaying the trigger signal to stroboscopically sample the waveform on the DUT.

11. The method described in claim 1 wherein the step of looping the test pattern on the DUT includes the step of operating the DUT in a system operating environment.

12. A laser synchronizing apparatus configured to test a device under test (DUT), comprising:
    a mode locked laser generating repeating laser pulses;
    a switch configured to select at least one sampling pulse from the repeating laser pulses to stroboscopically sample a waveform from the DUT;
    a counter coupled to the switch and configured to count the repeating laser pulses generated by the mode locked laser;
    a trigger signal configured to control clocking of the DUT;
    a phase lock loop coupled to the switch, the mode locked laser, and coupled to receive the trigger signal, the phase locked loop configured to synchronize the repeating laser pulses with the trigger signal; and
    a delay generator coupled to the phase lock loop to control a phase difference between the trigger signal and the repeating laser pulses;
    wherein the laser synchronizing apparatus is configured to loop a test pattern to test the DUT, each loop of the test pattern taking M clocks to execute, M being an integer, the mode locked laser generating N pulses during each loop of the test pattern, N being an integer.

13. The laser synchronizing apparatus described in claim 12 wherein each loop of the test pattern takes a time per test pattern to execute, each of the N pulses has a first period and each of the M clocks has a second period such that the time per test pattern to execute is a common multiple of the first and second periods.

14. The laser synchronizing apparatus described in claim 13 wherein the test pattern includes at least one dummy instruction so as to result in the test pattern taking the time per test pattern to execute.

15. The laser synchronizing apparatus described in claim 13 wherein the phase lock loop comprises:
    a phase detector coupled to the switch and coupled to receive the trigger signal, the phase detector detecting the phase difference between the trigger signal and the repeating laser pulses; and
    a reference oscillator coupled to the phase detector and the mode locked laser, the reference oscillator varying the first period of each of the N clocks within an operating range of the mode locked laser.

16. The laser synchronizing apparatus described in claim 12 wherein the delay generator is further coupled to receive the trigger signal, the delay generator delaying the trigger signal so as to control the phase difference between the trigger signal and the repeating laser pulses.

17. The laser synchronizing apparatus described in claim 12 wherein the delay generator is further coupled to the switch, the delay generator delaying the repeating laser pulses so as to control the phase difference between the trigger signal and the repeating laser pulses.

18. The laser synchronizing apparatus described in claim 12 further comprising a photodetector coupled to the counter and configured to detect the repeating laser pulses.

19. The laser synchronizing apparatus described in claim 12 wherein clocking of the DUT is varied such that each loop of the test pattern takes an additional K clocks to execute, K being an integer, each one of the K clocks having a third period, each of the N pulses having a first period and each of the M clocks having a second period such that each loop of the test pattern takes the M clocks at the second period and the K clocks at the third period to execute, the mode locked laser generating the N pulses during each loop of the test pattern.

20. The laser synchronizing apparatus described in claim 12 wherein the DUT is operated on a tester apparatus.

21. The laser synchronizing apparatus described in claim 12 wherein the DUT is operated in a system operating environment.

22. A laser synchronizing apparatus configured to test a device under test (DUT), comprising:

laser generating means for generating repeating laser pulses;

selection means for selecting at least one sampling pulse from the repeating laser pulses to stroboscopically sample a waveform from the DUT;

counting means coupled to the selection means for counting the repeating laser pulses generated by the laser generating means;

trigger means for generating a trigger signal configured to control clocking of the DUT;

synchronizing means coupled to the switch, the trigger means, and the mode locked laser for synchronizing the repeating laser pulses with the trigger signal; and phase generation means coupled to the synchronizing means for generating a phase difference between the trigger signal and the repeating laser pulses;

wherein the laser synchronizing apparatus is configured to loop a test pattern to test the DUT, each loop of the test pattern taking M clocks to execute, M being an integer, the mode locked laser generating N pulses during each loop of the test pattern, N being an integer.

23. The laser synchronizing apparatus described in claim 22 wherein each loop of the test pattern takes a time per test pattern to execute, each of the N pulses has a first period and each of the M clocks has a second period such that the time per test pattern to execute is a common multiple of the first and second periods.

24. The laser synchronizing apparatus described in claim 23 wherein the test pattern includes at least one dummy instruction so as to result in the test pattern taking the time per test pattern to execute.

25. The laser synchronizing apparatus described in claim 23 wherein the synchronizing means comprises:

phase detection means coupled to the trigger means and the selection means for detecting the phase difference between the trigger signal and the repeating laser pulses; and reference oscillation means coupled to the phase detection means and the laser generation means for generating a reference waveform to vary the first period of each of the N clocks within an operating range of the laser generation means.

26. The laser synchronizing apparatus described in claim 22 further comprising detection means coupled to the counting means for detecting the repeating laser pulses.

27. The laser synchronizing apparatus described in claim 22 wherein the DUT is operated on a tester apparatus.

28. The laser synchronizing apparatus described in claim 22 wherein the DUT is operated in a system operating environment.

* * * * *